(12) United States Patent
Huott et al.

(10) Patent No.: US 9,697,910 B1
(45) Date of Patent: Jul. 4, 2017

(54) MULTI-MATCH ERROR DETECTION IN CONTENT ADDRESSABLE MEMORY TESTING

(71) Applicant: International Business Machines Corporation, Armonk, NY (US)

(72) Inventors: William V. Huott, Holmes, NY (US); Pradip Patel, Poughkeepsie, NY (US); Daniel Rodko, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/084,639

(22) Filed: Mar. 30, 2016

(51) Int. Cl.
*G11C 29/02* (2006.01)
*G11C 29/12* (2006.01)
*G11C 15/00* (2006.01)

(52) U.S. Cl.
CPC .............. *G11C 29/02* (2013.01); *G11C 15/00* (2013.01); *G11C 29/12* (2013.01)

(58) Field of Classification Search
CPC .......... G11C 29/02; G11C 15/00; G11C 29/12
See application file for complete search history.

(56) References Cited

U.S. PATENT DOCUMENTS

| 6,295,576 B1* | 9/2001 | Ogura .................. G11C 15/04 365/49.17 |
| 6,430,072 B1 | 8/2002 | Chadwick et al. |
| 6,691,252 B2* | 2/2004 | Hughes ................. G11C 15/00 714/30 |
| 7,193,877 B1 | 3/2007 | Yelluru |
| 7,277,307 B1 | 10/2007 | Yelluru |
| 2002/0161969 A1* | 10/2002 | Nataraj ............ G06F 17/30982 711/108 |
| 2013/0322145 A1* | 12/2013 | Shin ....................... G11C 15/00 365/49.11 |

* cited by examiner

*Primary Examiner* — Harry W Byrne
*Assistant Examiner* — Ajay Ojha
(74) *Attorney, Agent, or Firm* — Cantor Colburn LLP; Margaret A. McNamara

(57) ABSTRACT

An aspect includes a method of multi-match error detection in content addressable memory (CAM) testing. The method includes loading a content addressing row of a CAM section with a row test address word. Data value rows of a random access memory (RAM) section are loaded with unique test patterns in each of the data value rows having a same number of on-state bits per data value row. A row test is initiated to search for a matching content addressing row in the CAM section corresponding to the row test address word. A row test result is received as one or more data value rows from the RAM section identified as having a content addressing row in the CAM section that matches the row test. The row test result is compared to an aspect of one or more of the unique test patterns to determine whether the row test has failed.

18 Claims, 5 Drawing Sheets

MULTI-MATCH ERROR DETECTION IN CONTENT ADDRESSABLE MEMORY TESTING

BACKGROUND

The present invention relates to computer memory systems, and more specifically, to multi-match error detection in content addressable memory testing.

In some computer systems, content addressable memory is used where memory locations are addressed based on contents rather than an encoded physical address. In a content addressable memory (CAM) device, a CAM section is used to identify a corresponding location in a random access memory (RAM) section that holds a data value, where each CAM section row has a corresponding RAM section row. Search and compare logic can be used to locate CAM section entries and return corresponding RAM section entries. The inclusion of a CAM device in a computer system design increases testing complexity due to potential mismatches and/or multiple matches of the search and compare logic. For example, to verify proper operation of the CAM device, it must be shown that a desired CAM row can be located on a content match and further that one or more other CAM rows are not also selected for the same content match (referred to as a multi-match error). When only summarized test results of attempted read operations are available, it can be difficult to ensure that multi-match errors are detected.

SUMMARY

According to one embodiment, a method of multi-match error detection in content addressable memory (CAM) testing is provided. The method includes loading one of a plurality of content addressing rows of a CAM section of a CAM device with a row test address word and remaining content addressing rows of the CAM section with other address values different from the row test address word. The method also includes loading a plurality of data value rows of a random access memory (RAM) section of the CAM device with unique test patterns in each of the data value rows, each of the unique test patterns having a same number of on-state bits per data value row. A row test is initiated to search for a matching content addressing row in the CAM section corresponding to the row test address word. A row test result is received as one or more data value rows from the RAM section identified as having a content addressing row in the CAM section that matches the row test address word. The row test result is compared to an aspect of one or more of the unique test patterns to determine whether the row test has failed.

According to another embodiment, a memory system includes a CAM device coupled through an interface to a memory controller. The memory system is configured to load one of a plurality of content addressing rows of a CAM section of the CAM device with a row test address word and remaining content addressing rows of the CAM section with other address values different from the row test address word. The memory system is further configured to load a plurality of data value rows of a RAM section of the CAM device with unique test patterns in each of the data value rows, where each of the unique test patterns has a same number of on-state bits per data value row. A row test is initiated to search for a matching content addressing row in the CAM section corresponding to the row test address word. A row test result is received as one or more data value rows from the RAM section identified as having a content addressing row in the CAM section that matches the row test address word. The row test result is compared to an aspect of one or more of the unique test patterns to determine whether the row test has failed.

According to yet another embodiment, a computer program product for multi-match error detection in CAM testing is provided. The computer program product includes a computer readable storage medium having program instructions embodied therewith. The program instructions are executable by processing circuitry to cause the processing circuitry to load one of a plurality of content addressing rows of a CAM section of a CAM device with a row test address word and remaining content addressing rows of the CAM section with other address values different from the row test address word. A plurality of data value rows of a RAM section of the CAM device is loaded with unique test patterns in each of the data value rows, where each of the unique test patterns has a same number of on-state bits per data value row. A row test is initiated to search for a matching content addressing row in the CAM section corresponding to the row test address word. A row test result is received as one or more data value rows from the RAM section identified as having a content addressing row in the CAM section that matches the row test address word. The row test result is compared to an aspect of one or more of the unique test patterns to determine whether the row test has failed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein are directed to multi-match error detection in content addressable memory (CAM) of a computer system. Embodiments enable full detection of combinations of multi-match errors in a CAM device under test through test pattern initialization and delivery to the CAM device under test. A uniquely detectable test pattern can be loaded onto each RAM row of the CAM device under test, where each unique test pattern cannot be aliased into any other RAM rows without producing a detectable multi-match error condition. The pattern of expected passing results for any row access is detectable as a failing result if any number of rows is incorrectly multi-matched on any given test cycle.

Embodiments initialize the RAM section contents of a CAM device such that, in addition to each data value row receiving unique values to store as unique test patterns, the values of the unique test patterns are selected such that if more than one data value row is selected during a CAM operation, the result is identifiable as a multi-match error. The identification of a multi-match error can be achieved by using unique test patterns having a same number of on-state bits (e.g., value of '1') per data value row while not repeating the same test pattern in any two RAM section rows at the same time. A multi-match error is typically characterized by a logical OR'ing of data value rows from the contents of multiple rows during a read operation. By using unique test patterns that have the same number of on-state bits (and conversely the same number of off-state bits), a multi-match error condition will result in a different number of on-state bits in an output word of the CAM device than a single matching result would produce. The process of selecting unique test patterns and detecting multi-match error conditions is further described herein.

Figure 1:
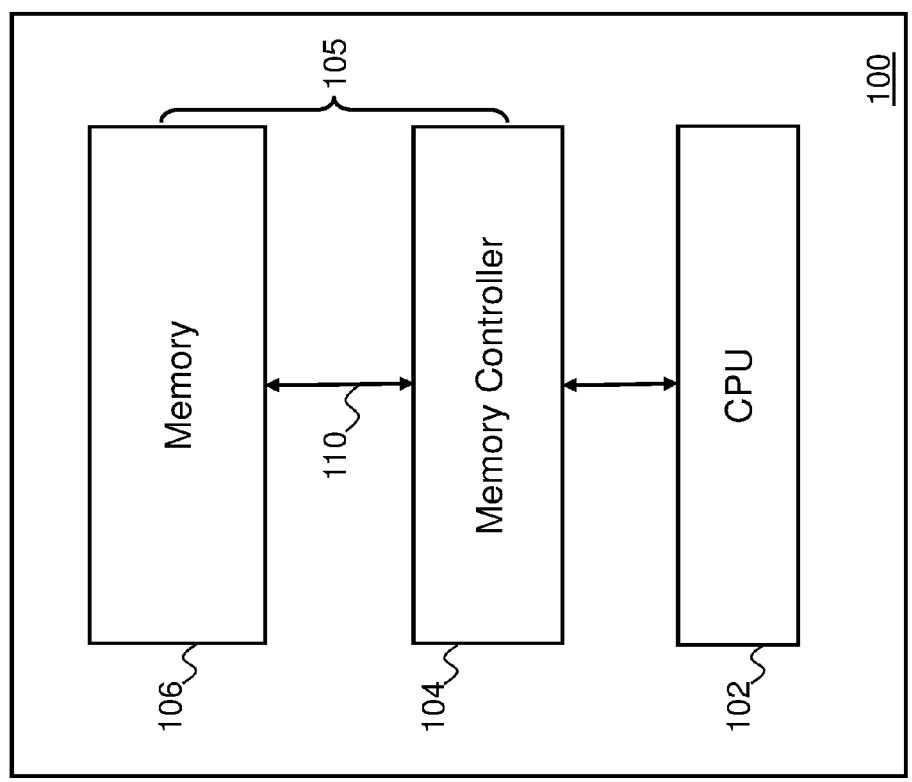
FIG. 1 is a block diagram of an exemplary system according to embodiments.

FIG. 1 illustrates a block diagram of a system 100, which is a computer system that supports multi-match error detection in content addressable memory testing in accordance with an embodiment. The system 100 depicted in FIG. 1 includes a computer processor 102, memory 106 including multiple memory devices, and a memory controller 104 for reading and storing data in the memory 106 via an interface 110. Collectively, the memory controller 104 and the memory 106 are referred to as a memory system 105. The computer processor 102 can be a single core or multi-core processor.

In one embodiment the memory controller 104 is coupled to the computer processor 102 and receives read or write requests from the computer processor 102. The memory controller 104 can send commands and send/receive data on the interface 110 to/from the memory 106. The memory controller 104 may also initiate built-in self-test (BIST) of the memory 106.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
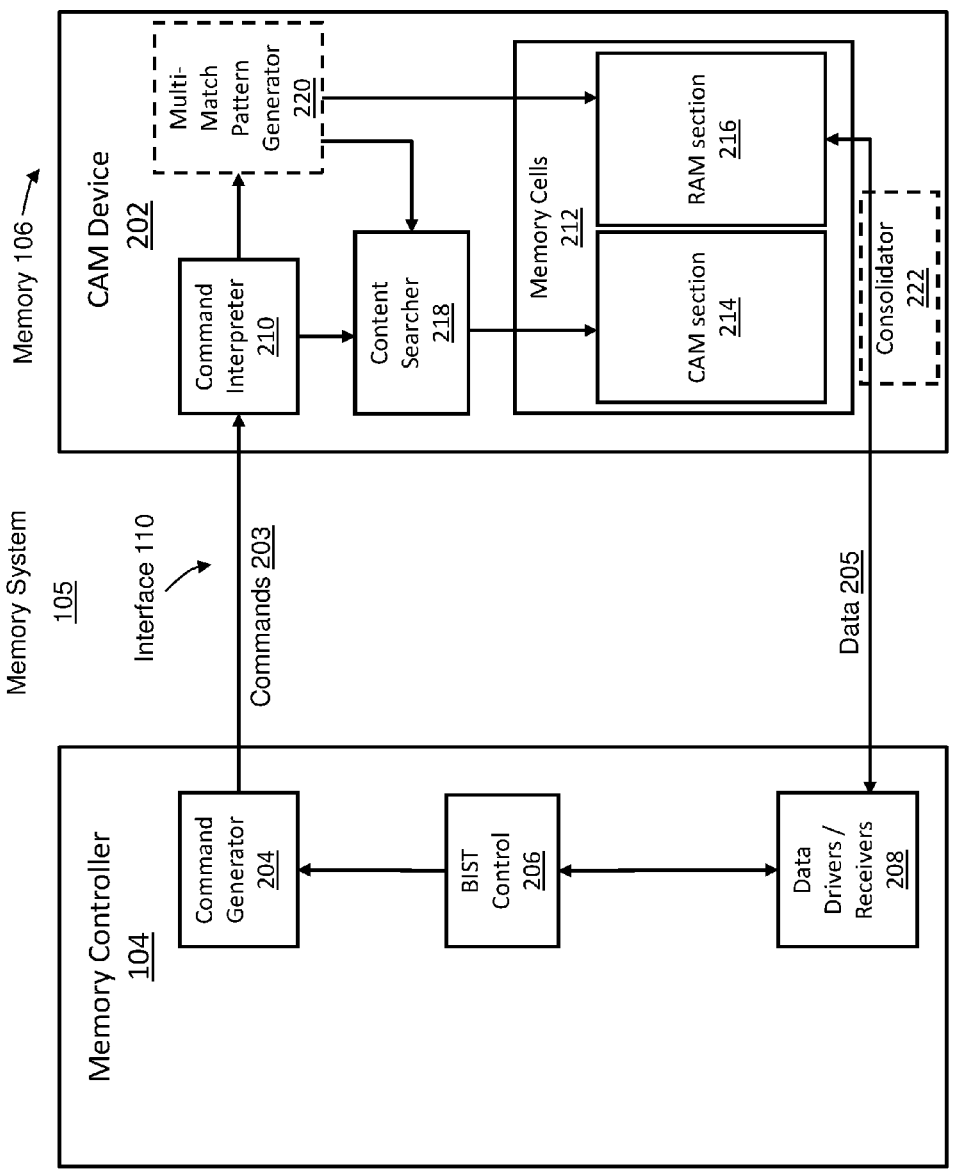
FIG. 2 is a block diagram of a memory system according to an embodiment.

FIG. 2 is a block diagram of a portion of the memory system 105 of FIG. 1 according to an embodiment. The memory system 105 includes memory controller 104 coupled to memory 106 via interface 110. In the example of FIG. 2, memory 106 includes as a CAM device 202. It will be understood that the memory controller 104 can interface with one or more CAM devices 202 and other memory devices which may be organized in memory ranks, memory banks, memory modules, or the like. The interface 110 includes a plurality of links that may be unidirectional or bidirectional to propagate commands 203, data 205, and/or other signals between the memory controller 104 and the CAM device 202.

In the example of FIG. 2, the memory controller 104 includes a command generator 204, a BIST control 206, and data drivers/receivers 208. It will be understood that the memory controller 104 includes other interfaces and logic (e.g., processing circuitry) that are not depicted in FIG. 2, for instance, to support communication with computer processor 102 of FIG. 1, as well as various state machines, interfaces to other types of memory devices, and the like.

The CAM device 202 includes a command interpreter 210 operable to receive commands 203 from command generator 204. Commands 203 may include memory read, memory write, and device configuration commands. However, rather than sending physical addresses of data value rows to be accessed in a RAM section 216 of memory cells 212 in the CAM device 202, content to be located in a CAM section 214 of the memory cells 212 is provided to a content searcher 218. The content searcher 218 searches the CAM section 214 for a matching content addressing row of the CAM section 214 and the corresponding data value row of the RAM section 216 is output as a result. If there is more than one matching row in the CAM section 214, multiple data value rows from the RAM section 216 may be output simultaneously as a logical OR function, where any on-state values of the selected data rows are also set in the multi-match output. The "on-state" value and "off-state" value can be a logical '1' or a logical '0' depending on the implementation.

In an embodiment, the CAM device 202 includes a multi-match pattern generator 220 that forms unique test patterns having a same number of on-state bits per data value row of the RAM section 216. Further, the unique test patterns are formed such that none of the unique test patterns is equivalent to a logical-OR combination of any two of the unique test patterns. The BIST control 206 can send a BIST initialization command through the command generator 204 to the command interpreter 210 to trigger the multi-match pattern generator 220 to load data value rows of the RAM section 216 with the unique test patterns. In an alternate embodiment, the multi-match pattern generator 220 is omitted or implemented elsewhere in the system 100 of FIG. 1. For example, the BIST control 206 can directly preload the RAM section 216 with the unique test patterns.

The CAM device 202 may also include a consolidator 222 that summarizes the results of one or more test cases in the CAM device 202 and sends a summarized test result rather than the actual data values as data 205 for further analysis by the BIST control 206, e.g., to determine a pass/fail result. For example, the consolidator 222 can perform a bitwise XOR function of a read result from the RAM section 216 to confirm whether an even or odd number of bits are in the on-state (or off-state). Further, the consolidator 222 may summarize results from multiple data value row read attempts of the RAM section 216 as part of a same test or multiple test iterations.

Figure 3:
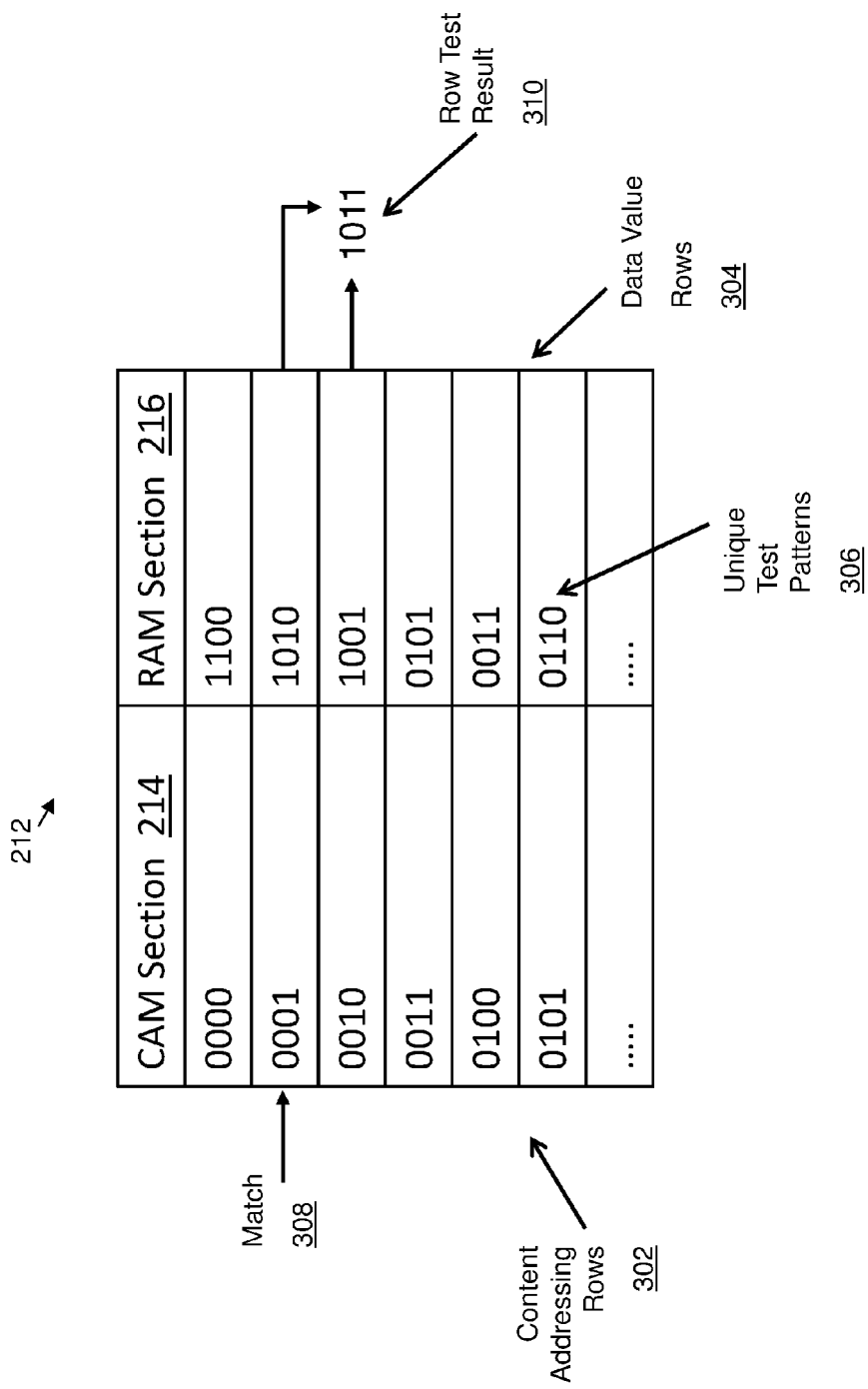
FIG. 3 is a block diagram of content addressable memory according to an embodiment.

FIG. 3 depicts an example of a portion of the memory cells 212 of CAM device 202 of FIG. 2 according to an embodiment. In the example of FIG. 3, CAM section 214 includes content addressing rows 302 having values of "0000", "0001", "0010", "0011", "0100", and "0101". RAM section 216 includes data value rows 304 having unique test patterns 306 of "1100", "1010", "1001", "0101", "0011", and "0110". Thus, in this example each of the unique test patterns 306 includes two binary '1' values (e.g., on-state bits) and two binary '0' values (e.g., off-state bits). If a CAM compare operation is done for vector "0000" through content searcher 218 of FIG. 2, this matches the first row of the CAM section 214, and therefore the expected output from the CAM device 202 would be "1100" as the corresponding data value row 304 from the RAM section 216.

A multi-match error condition can be identified based on an aspect of one or more of the unique test patterns 306 when a match 308 is identified in the CAM section 214 as part of a row test. For instance, a search for "0001" as a row test address word in the content addressing rows 302 should result in selecting a data value row 304 with a value of "1010". However, if a data value row 304 with a value of "1001" is also selected, the row test result 310 can be "1011", which is a logical OR equivalent of "1010" with "1001". Thus, a mismatch against an expected test value of "1010" is one aspect that can identify a failure. A further aspect that can identify a failure is detecting a change in the number of on-state bits in the row test result 310, e.g., three bits set to '1' when all patterns only have two bits set to '1'. Another aspect to identify a failure is a change in the number of off-state bits in the row test result 310, e.g., one bit set to '0' when all patterns only have two bits set to '0'. While the example of FIG. 3, only depicts six examples covering four bits, it will be understood that the patterns can be scaled depending on the word width per row and total number of rows under test such that the results can detect any multi-match error conditions.

Figure 4:
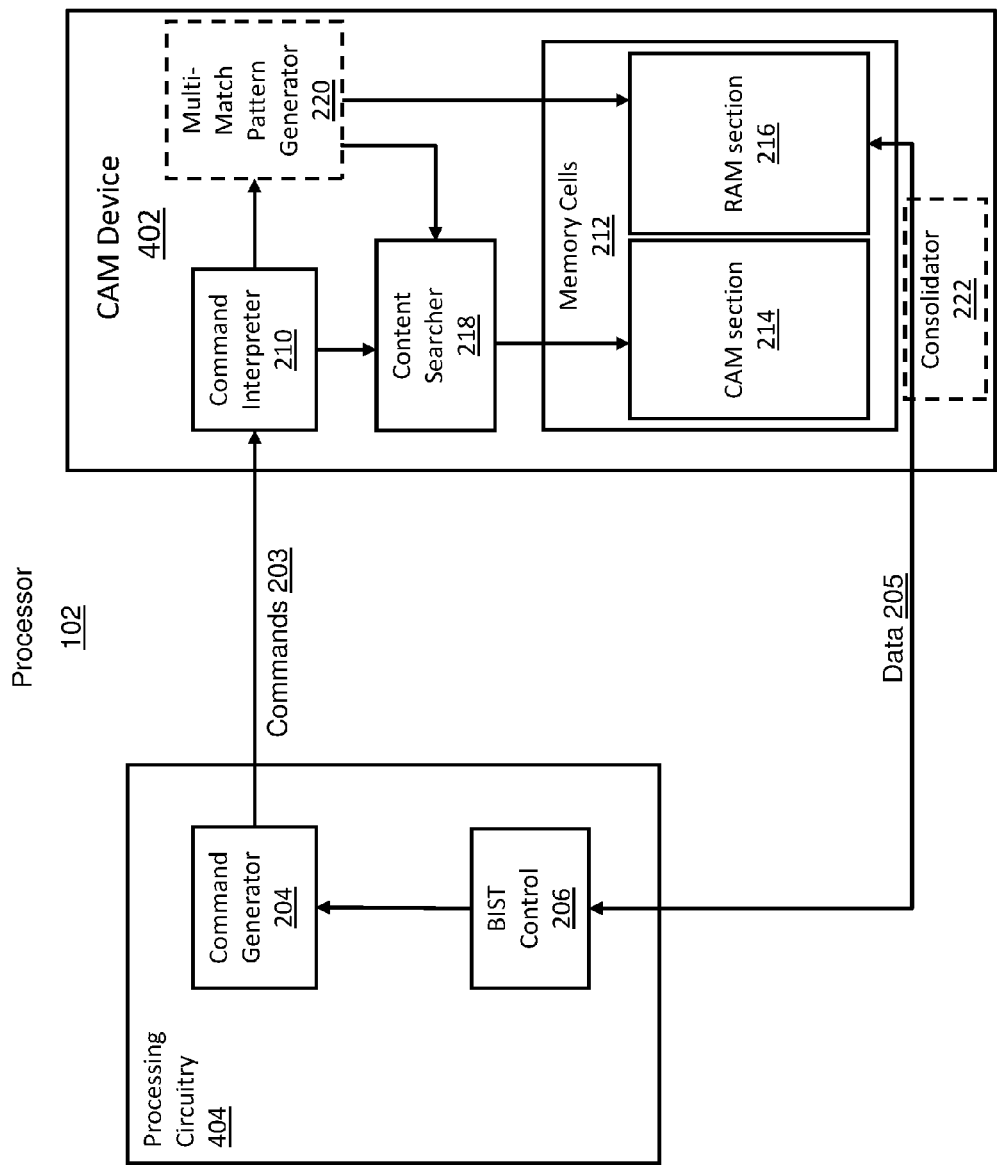
FIG. 4 is block diagram of a processing system according to an embodiment.

FIG. 4 is a block diagram of a processing system according to an embodiment, where a CAM device 402 is incorporated within the processor 102 of FIG. 1. For example, processing circuitry 404 of the processor 102 may include the command generator 204 and BIST control 206 of FIG. 2. The CAM device 402 may be substantially equivalent to the CAM device 202 of FIG. 2 with a packaging change to be integrated within the processor 102. In the example of FIG. 4, the BIST control 206 can directly access data 205 from the CAM device 402. In alternate embodiments, the data drivers/receivers 208 of FIG. 2 can be included to interface between the BIST control 206 and the CAM device 402.

Figure 5:
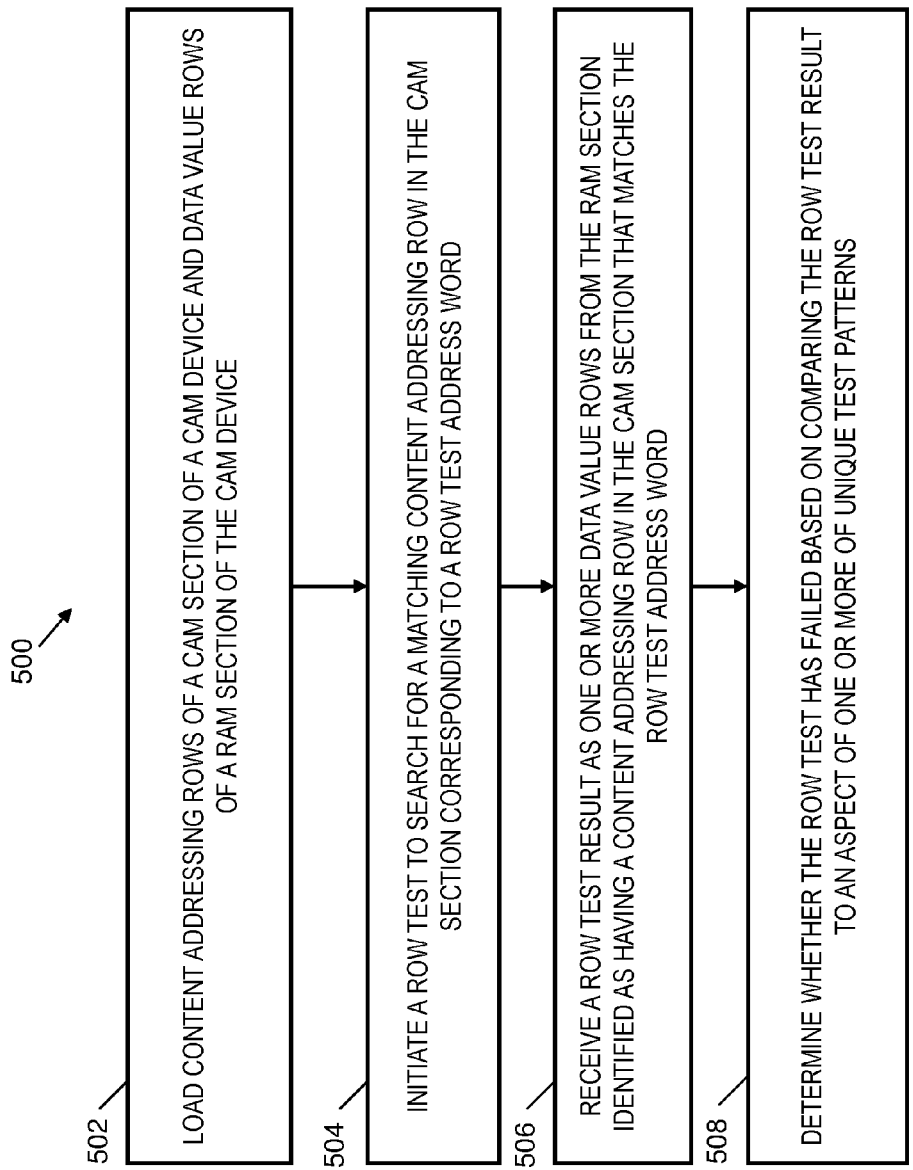
FIG. 5 is a process flow according to an embodiment.

FIG. 5 is a process flow of a method 500 according to an embodiment. The method 500 can be performed by various elements of the system 100 of FIG. 1, such as the memory system 105 of FIG. 1, and is described in reference to FIGS. 1-5. Although a particular order of blocks is depicted and described with respect to FIG. 5, it will be understood that the order can be changed, and the blocks may be combined or further subdivided. For purposes of explanation, the method 500 is described with respect to the memory controller 104 and the CAM device 202.

At block 502, one of the content addressing rows 302 of the CAM section 214 of CAM device 202 can be loaded with a row test address word and remaining content addressing rows 302 of the CAM section 214 are loaded with other address values that are different from the row test address word such that a unique match is expected upon subsequently searching the CAM section 214 for the row test address word. The values in the CAM section 214 may all be set to unique values representing different row test address words. Data value rows 304 of the RAM section 216 of the CAM device 202 are loaded with unique test patterns 306 in each of the data value rows 304, where each of the unique test patterns 306 have a same number of on-state bits per data value row. The multi-match pattern generator 220 can load the data value rows 304 with the unique test patterns 306 based on receiving a built-in self-test command. The unique test patterns 306 can be formed such that none of the unique test patterns 306 is equivalent to a logical-OR combination of any two of the unique test patterns 306, for instance, when a testing aspect of one or more of the unique test patterns 306 is a number of on-state bits. Alternatively, the unique test patterns 306 can be formed such that none of the unique test patterns 306 is equivalent to a logical-AND combination of any two of the unique test patterns 306, for instance, when a testing aspect of one or more of the unique test patterns 306 is a number of off-state bits.

At block 504, a row test is initiated to search for a matching content addressing row 302 in the CAM section 214 corresponding to the row test address word. Searching may be performed by the content searcher 218. Loading of the data value rows 304 with the unique test patterns 306 can be performed for all of the data value rows 304 in the CAM device 202 prior to generating a row test result 310.

At block 506, the row test result 310 is received as one or more data value rows 304 from the RAM section 216 identified as having a content addressing row 302 in the CAM section 214 that matches the row test address word. The row test results 310 can be received at the BIST control 206 as the actual value read from the RAM section 216 or can be summarized by the consolidator 222 as a summary of the one or more data value rows 304.

At block 508, the BIST control 206 can determine whether the row test has failed based on comparing the row test result 310 to an aspect of one or more of the unique test patterns 306. The aspect of one or more of the unique test patterns 306 can be a test pattern value, a number of on-state bits, and/or a number of off-state bits. Further testing of the CAM device 202 can include detection of a multi-match condition when the CAM section 214 is initialized with a common value in two or more of the content addressing rows 302. Additionally, testing can search a row test address word that is not loaded into the CAM section 214 to test a no-match condition.

Technical effects and benefits include utilization of unique test patterns to simplify and shorten a CAM device test procedure in such a way that multi-match or no-match error conditions within the CAM device are detectable in a single pass without extended test cases.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of multi-match error detection in content addressable memory (CAM) testing, the method comprising:
  loading one of a plurality of content addressing rows of a CAM section of a CAM device with a row test address word and remaining content addressing rows of the CAM section with other address values different from the row test address word;
  loading a plurality of data value rows of a random access memory (RAM) section of the CAM device with unique test patterns in each of the data value rows, each of the unique test patterns having a same number of on-state bits per data value row, and the unique test patterns are formed such that either none of the unique test patterns is equivalent to a logical-OR combination of any two of the unique test patterns or the unique test patterns are formed such that none of the unique test patterns is equivalent to a logical-AND combination of any two of the unique test patterns;
  initiating a row test to search for a matching content addressing row in the CAM section corresponding to the row test address word;
  receiving a row test result as one or more data value rows from the RAM section identified as having a content addressing row in the CAM section that matches the row test address word; and
  determining whether the row test has failed based on comparing the row test result to an aspect of one or more of the unique test patterns.

2. The method according to claim 1, wherein the aspect of one or more of the unique test patterns is a test pattern value.

3. The method according to claim 1, wherein the aspect of one or more of the unique test patterns is a number of on-state bits.

4. The method according to claim 1, wherein the aspect of one or more of the unique test patterns is a number of off-state bits.

5. The method according to claim 1, wherein a multi-match pattern generator loads the data value rows of the RAM section of the CAM device with the unique test patterns based on receiving a built-in self-test command.

6. The method according to claim 1, wherein loading the data value rows of the RAM section of the CAM device with the unique test patterns is performed for all of the data value rows in the RAM section of the CAM device prior to generating the row test result.

7. A memory system comprising:
  a content addressable memory (CAM) device coupled through an interface to a memory controller, the memory system configured to perform:
    loading one of a plurality of content addressing rows of a CAM section of the CAM device with a row test address word and remaining content addressing rows of the CAM section with other address values different from the row test address word;
    loading a plurality of data value rows of a random access memory (RAM) section of the CAM device with unique test patterns in each of the data value rows, each of the unique test patterns having a same number of on-state bits per data value row, and the unique test patterns are formed such that either none of the unique test patterns is equivalent to a logical-OR combination of any two of the unique test patterns or the unique test patterns are formed such that none of the unique test patterns is equivalent to a logical-AND combination of any two of the unique test patterns;
    initiating a row test to search for a matching content addressing row in the CAM section corresponding to the row test address word;
    receiving a row test result as one or more data value rows from the RAM section identified as having a content addressing row in the CAM section that matches the row test address word; and
    determining whether the row test has failed based on comparing the row test result to an aspect of one or more of the unique test patterns.

8. The memory system according to claim 7, wherein the aspect of one or more of the unique test patterns is a test pattern value.

9. The memory system according to claim 7, wherein the aspect of one or more of the unique test patterns is a number of on-state bits.

10. The memory system according to claim 7, wherein the aspect of one or more of the unique test patterns is a number of off-state bits.

11. The memory system according to claim 7, wherein a multi-match pattern generator loads the data value rows of the RAM section of the CAM device with the unique test patterns based on receiving a built-in self-test command.

12. The memory system according to claim 7, loading the data value rows of the RAM section of the CAM device with the unique test patterns is performed for all of the data value rows in the RAM section of the CAM device prior to generating the row test result.

13. A computer program product for multi-match error detection in content addressable memory (CAM) testing, the computer program product comprising a non-transitory computer readable storage medium having program instructions embodied therewith, the program instructions executable by processing circuitry to cause the processing circuitry to:
  load one of a plurality of content addressing rows of a CAM section of a CAM device with a row test address word and remaining content addressing rows of the CAM section with other address values different from the row test address word;
  load a plurality of data value rows of a random access memory (RAM) section of the CAM device with unique test patterns in each of the data value rows, each of the unique test patterns having a same number of on-state bits per data value row, and the unique test patterns are formed such that either none of the unique test patterns is equivalent to a logical-OR combination of any two of the unique test patterns or the unique test patterns are formed such that none of the unique test patterns is equivalent to a logical-AND combination of any two of the unique test patterns;
  initiate a row test to search for a matching content addressing row in the CAM section corresponding to the row test address word;

receive a row test result as one or more data value rows from the RAM section identified as having a content addressing row in the CAM section that matches the row test address word; and determine whether the row test has failed based on comparing the row test result to an aspect of one or more of the unique test patterns.

14. The computer program product according to claim 13, wherein the aspect of one or more of the unique test patterns is a test pattern value.

15. The computer program product according to claim 13, wherein the aspect of one or more of the unique test patterns is a number of on-state bits.

16. The computer program product according to claim 13, wherein the aspect of one or more of the unique test patterns is a number of off-state bits.

17. The computer program product according to claim 13, wherein a multi-match pattern generator loads the data value rows of the RAM section of the CAM device with the unique test patterns based on receiving a built-in self-test command.

18. The computer program product according to claim 13, wherein loading the data value rows of the RAM section of the CAM device with the unique test patterns is performed for all of the data value rows in the RAM section of the CAM device prior to generating the row test result.

* * * * *